(12) United States Patent
Mullady

(10) Patent No.: US 8,854,808 B2
(45) Date of Patent: Oct. 7, 2014

(54) FITTING FOR FLEXIBLE MANIFOLD SYSTEM

(75) Inventor: Robert K. Mullady, Highland, NY (US)

(73) Assignee: International Business Machines Corporation, Armonk, NY (US)

( * ) Notice: Subject to any disclaimer, the term of this patent is extended or adjusted under 35 U.S.C. 154(b) by 275 days.

(21) Appl. No.: 13/534,821

(22) Filed: Jun. 27, 2012

(65) Prior Publication Data

US 2014/0002993 A1    Jan. 2, 2014

(51) Int. Cl.
*G06F 1/20* (2006.01)
*H05K 7/20* (2006.01)
*F16L 41/02* (2006.01)

(52) U.S. Cl.
USPC .................. 361/679.53; 361/699; 285/133.11

(58) Field of Classification Search
USPC .............. 361/679.53, 699; 285/133.11–133.6
See application file for complete search history.

(56) References Cited

U.S. PATENT DOCUMENTS

| | | | |
|---|---|---|---|
| 4,887,848 A * | 12/1989 | Burba .............................. | 285/55 |
| 4,971,366 A | 11/1990 | Towsley | |
| 4,993,453 A * | 2/1991 | McHugh ....................... | 137/559 |
| 4,995,423 A * | 2/1991 | McHugh ....................... | 137/559 |
| 5,036,883 A * | 8/1991 | McHugh ....................... | 137/559 |
| 5,303,504 A * | 4/1994 | Buzzell ............................. | 47/52 |
| 6,899,355 B2 | 5/2005 | Klein et al. | |
| 6,978,636 B2 | 12/2005 | Motush et al. | |
| 7,090,658 B2 | 8/2006 | Fariers, Jr. et al. | |
| 7,373,825 B2 | 5/2008 | Fennington, Jr. | |
| 7,568,496 B2 * | 8/2009 | Kraenzle ..................... | 137/454.2 |
| 7,717,475 B2 * | 5/2010 | Savelle et al. ................. | 285/179 |
| 2007/0001447 A1 | 1/2007 | Fennington, Jr. | |
| 2007/0057503 A1 | 3/2007 | Hawkins | |
| 2014/0110932 A1* | 4/2014 | Gramling et al. .......... | 285/126.1 |

FOREIGN PATENT DOCUMENTS

DE   202007001594 U1   6/2007
WO       9733118 A1    9/1997

* cited by examiner

*Primary Examiner* — Robert J Hoffberg
(74) *Attorney, Agent, or Firm* — Cantor Colburn LLP; Margaret McNamara

(57) ABSTRACT

A fitting includes a body, a first connection member provided on the body, a second connection member provided on the body opposite to the first connection member, a third connection member provided on the body generally perpendicular to the first and second connection members, and a flange extending from the body substantially perpendicular to the first, second, and third connection members. The flange includes a captive mounting fastener configured and disposed to secure the fitting to a substrate.

16 Claims, 4 Drawing Sheets

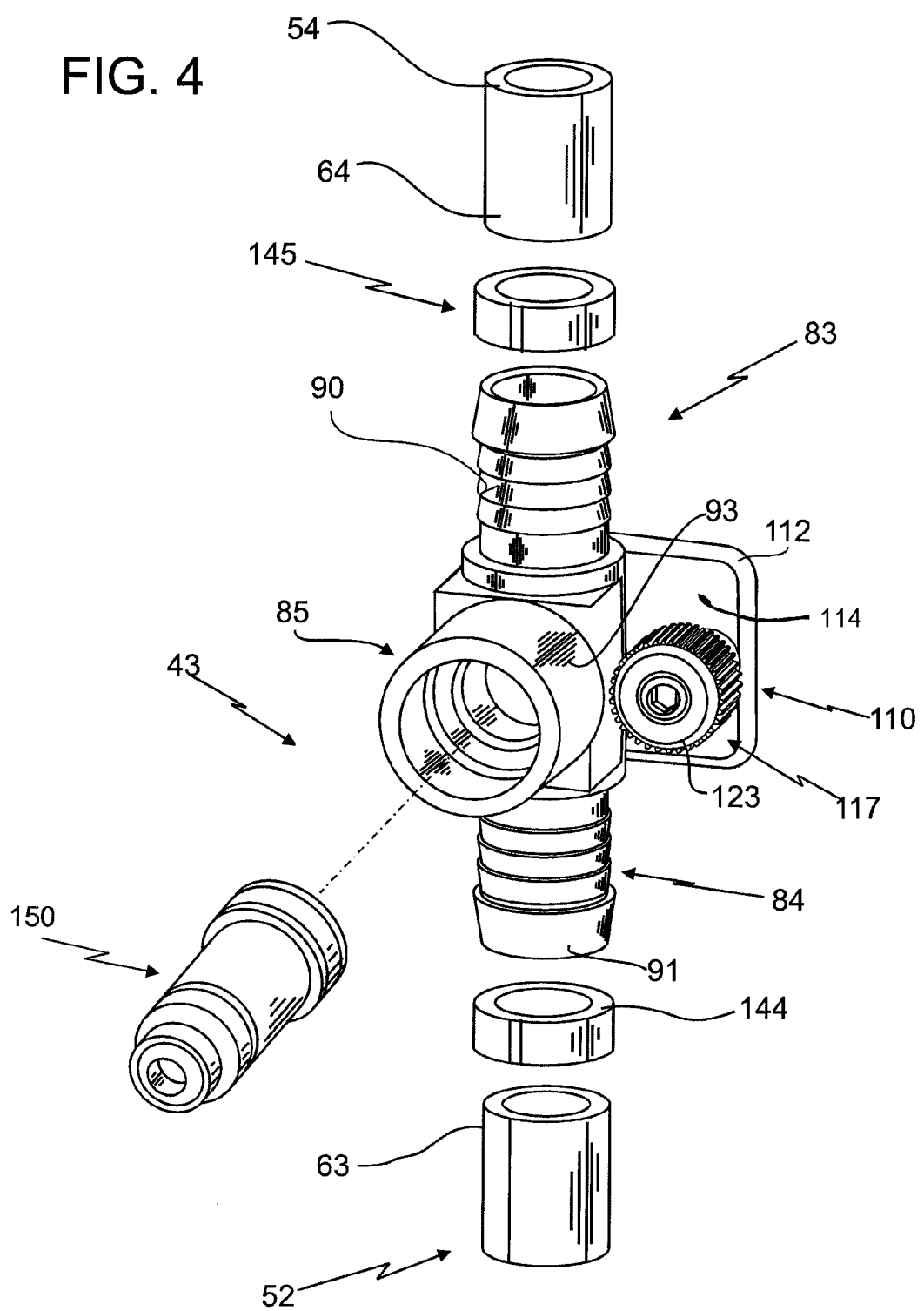

FITTING FOR FLEXIBLE MANIFOLD SYSTEM

BACKGROUND

The present invention relates to the art of cooling fluid manifolds, and more specifically, to a fitting for a flexible manifold system.

Many cooling fluid manifolds, particularly those used in connection with computer systems, employ rigid copper or stainless steel piping that are joined using standard fittings. The rigid piping is bent to a desired shape and secured to, for example, a computer rack. The standard fittings are used to connect discrete portions of the rigid pipe. The standard fittings often include threaded connections or require brazed connections to establish a joint with the rigid piping. The rigid piping and/or standard fittings are generally joined to the computer rack using cable ties, pipe straps or the like.

SUMMARY

According to one exemplary embodiment, a fitting includes a body, a first connection member provided on the body, a second connection member provided on the body opposite to the first connection member, a third connection member provided on the body generally perpendicular to the first and second connection members, and a flange extending from the body substantially perpendicular to the first, second, and third connection members. The flange includes a captive mounting fastener configured and disposed to secure the fitting to a substrate.

According to another exemplary embodiment, a cooling fluid manifold system includes at least one fitting including a body, a first connection member provided on the body, a second connection member provided on the body opposite to the first connection member, a third connection member provided on the body generally perpendicular to the first and second connection members, and a flange extending from the body substantially perpendicular to the first, second, and third connection members. The flange includes a captive mounting fastener configured and disposed to secure the fitting to a substrate. A first conduit is operatively connected to the first connection member, and a second conduit is operatively connected to the second connection member.

According to yet another exemplary embodiment, a computer rack system includes a plurality of rail members supporting at least one tier, at least one computer system supported by the at least one tier, and a cooling fluid manifold system coupled to one of the plurality of rails and operatively associated with the at least one computer system. The cooling fluid manifold system includes at least one fitting including a body, a first connection member provided on the body, a second connection member provided on the body opposite to the first connection member, a third connection member provided on the body generally perpendicular to the first and second connection members, and a flange extending from the body substantially perpendicular to the first, second, and third connection members. The flange includes a captive mounting fastener operatively connected to the one of the plurality of rails. A first conduit is operatively connected to the first connection member, and a second conduit is operatively connected to the second connection member.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 4 depicts a detail view of a portion of the cooling fluid manifold system of FIG. 1.

DETAILED DESCRIPTION

Figure 1:
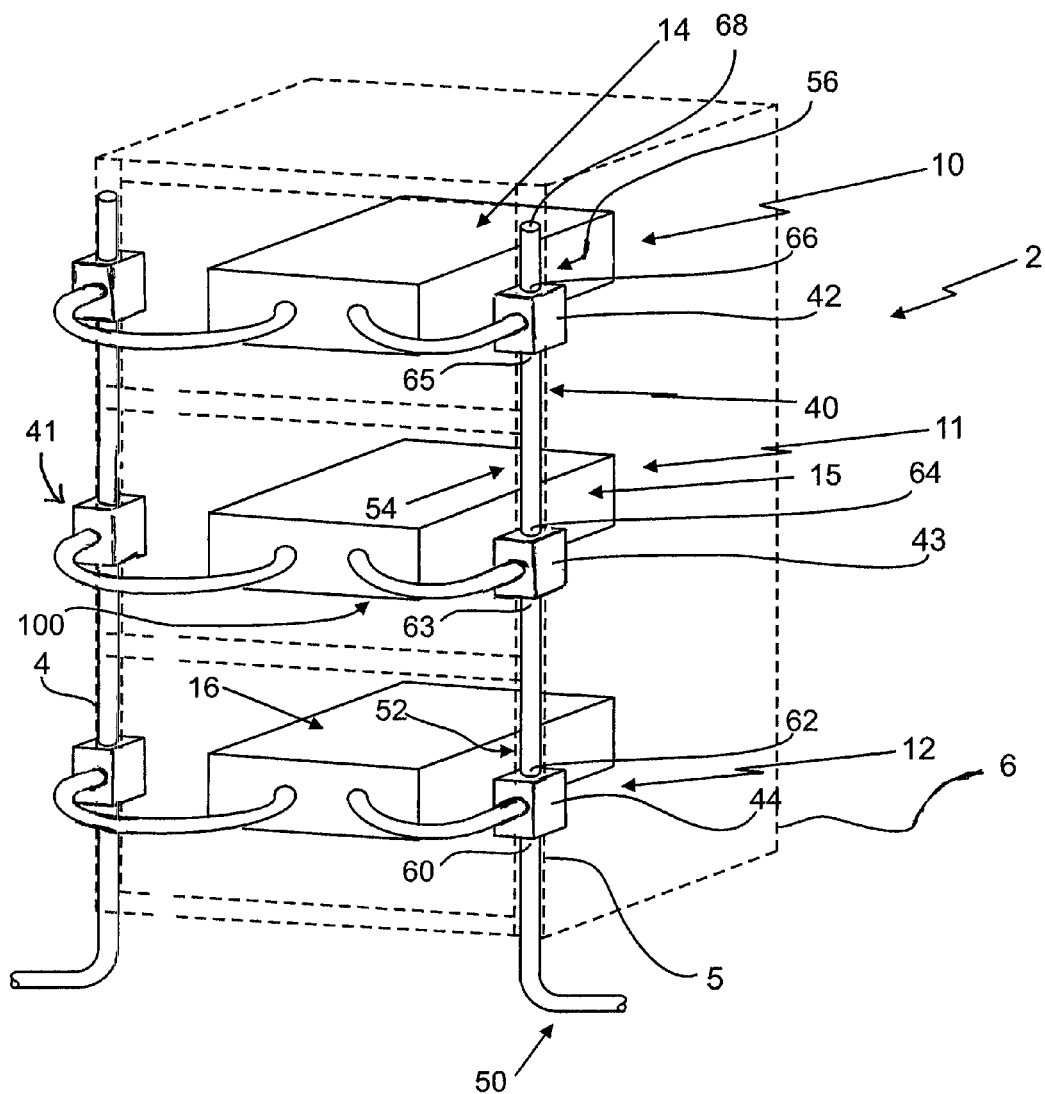
FIG. 1 depicts a computer rack system including a cooling fluid manifold system having a plurality of fittings in accordance with an exemplary embodiment.

With reference now to FIG. 1, a computer rack system in accordance with an exemplary embodiment is indicated generally at 2. Computer rack system 2 includes a first rail 4, a second rail 5, a third rail 6, and a fourth rail (not shown). Rails 4-6 support first, second, and third tiers 10, 11 and 12. Each tier 10, 11 and 12 supports a corresponding computer system 14, 15, and 16. Computer rack system 2 includes a cooling fluid manifold system 40 that delivers cooling fluid to each computer system 14, 15, and 16. A second cooling fluid manifold system 41 that delivers cooling fluid from computer systems 14, 15, and 16 to a heat exchanger (not shown).

Cooling fluid manifold system 40 includes a first fitting 42, a second fitting 43, and a third fitting 44. A first conduit 50 is fluidically coupled to third fitting 44, a second conduit 52 fluidically connects third fitting 44 and second fitting 43, a third conduit 54 fluidically connects with second fitting 43 and first fitting 42, and a fourth conduit 56 extends from first fitting 42. First conduit 50 is a rigid pipe and includes a first end (not shown) that is fluidically coupled to a cooling fluid supply (also not shown) and extends to a second end 60. Second conduit 52 is a flexible pipe and includes a first end 62 fluidically coupled to third fitting 44 and a second end 63 fluidically coupled to second fitting 43. Third conduit 54 is also a flexible pipe and includes a first end 64 fluidically coupled to second fitting 43 and a second end 65 fluidically coupled to first fitting 42. Fourth conduit 56 includes a first end 66 that extends from first fitting 42 and is provided with an end cap 68.

Figure 2:
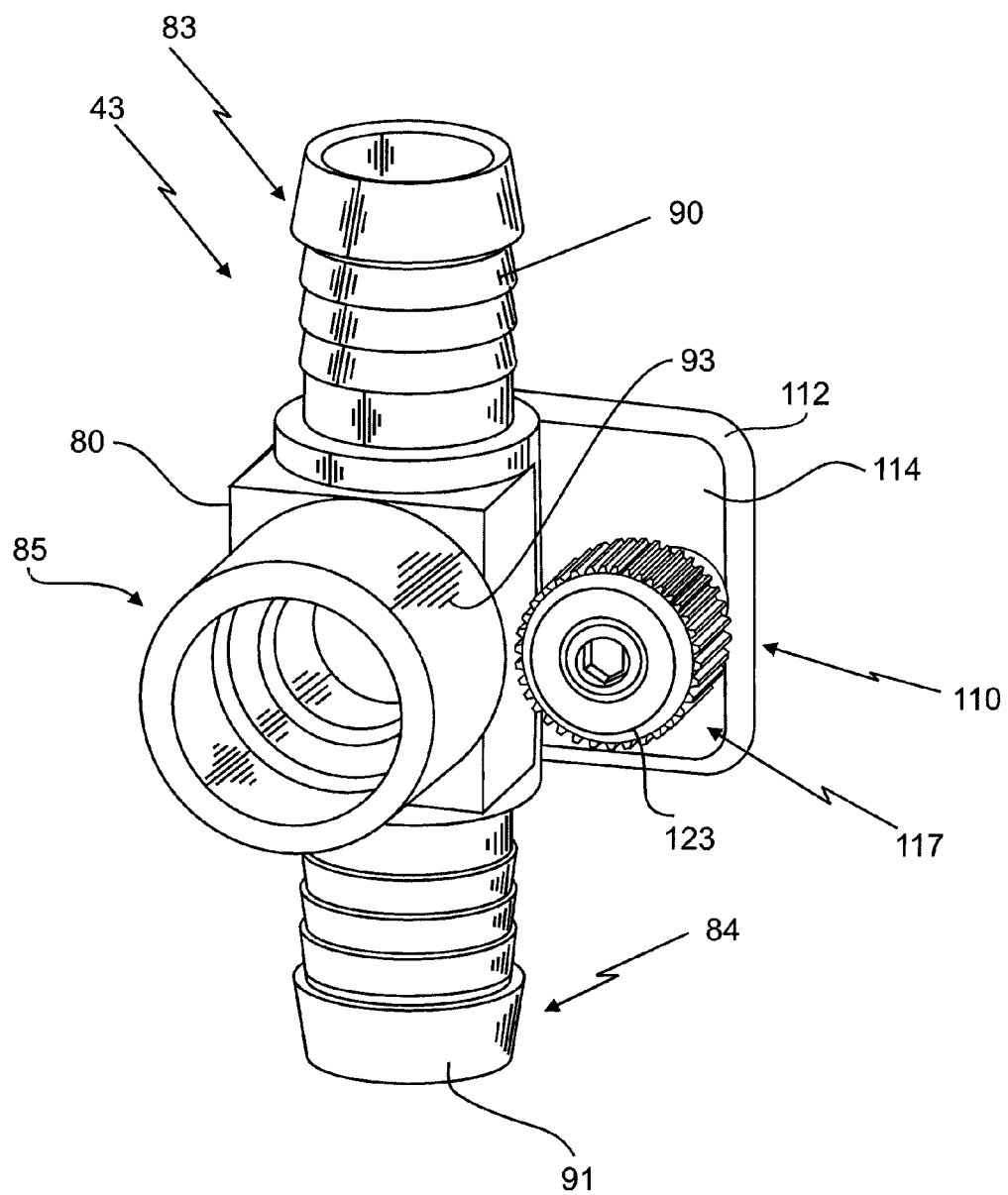
FIG. 2 depicts a perspective view of one of the plurality of fitting of FIG. 1.
Figure 3:
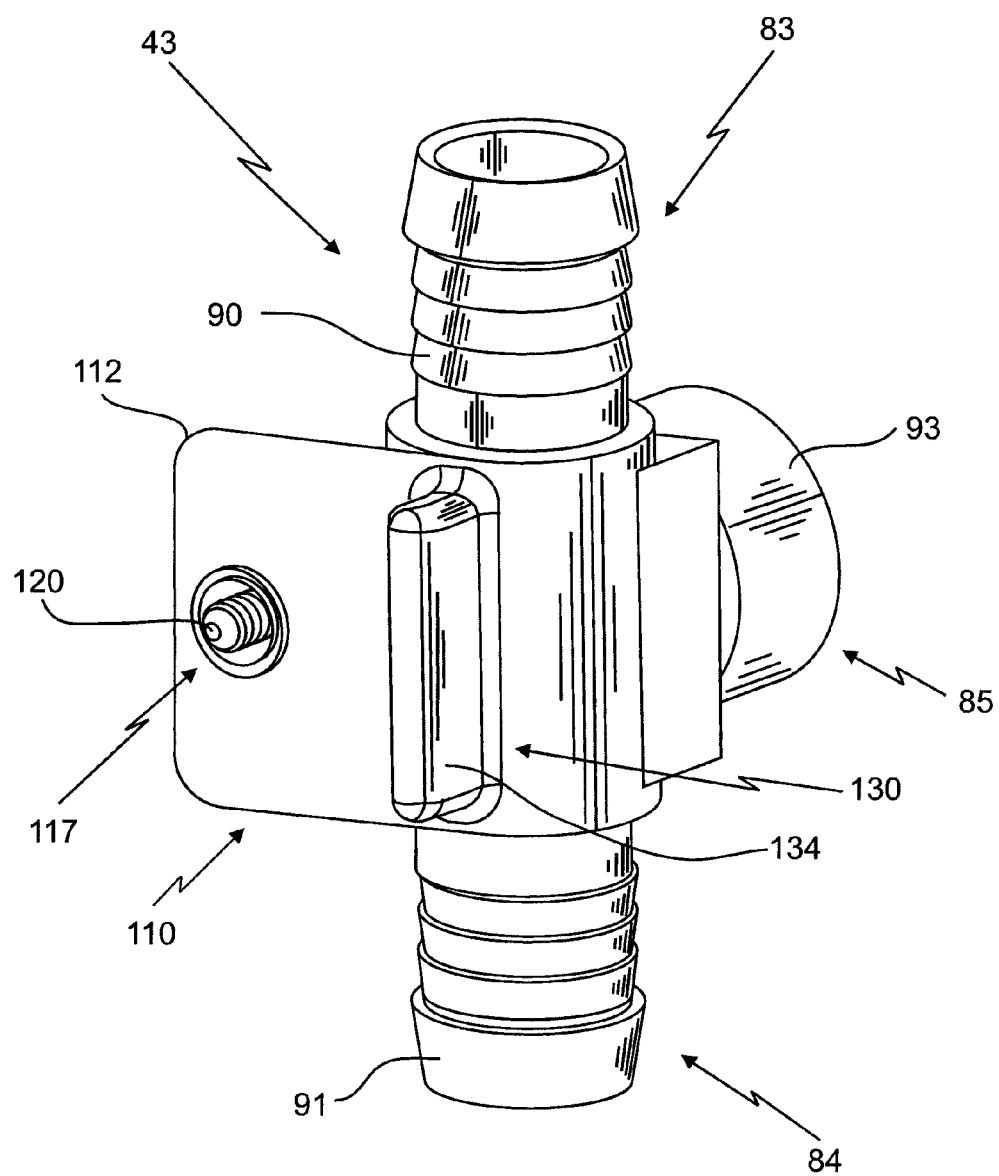
FIG. 3 depicts another perspective view of the one of the plurality of fittings of FIG. 1.

A detailed description will now follow referencing FIGS. 2 and 3 in describing second fitting 43. Second fitting 43 includes a body 80 having a first connection member 83, a second connection member 84, and a third connection member 85. First connection member 83 is shown in the form of a barb fitting 90. Second connection member 84 is positioned opposite to first connection member 83 and is also shown in the form of a barb fitting 91. Third connection member 85 is arranged substantially perpendicularly to first and second connection members 83 and 84 and is shown in the form of a quick connect fitting 93. At this point, it should be understood that the connection members may take on a variety of forms. For example, when connecting to a rigid tube such as shown in connection with third fitting 44, one of the connection members may constitute a threaded connector. Also, it should be understood that third connection member 85 may be a threaded connector. Third connection member 85 may directly connect to a cooling system (not shown) associated with computer system 15 through a conduit 100 (FIG. 1) or may connect to conduit 100 through an accessory as will become more readily apparent below.

In further accordance with an exemplary embodiment, second fitting 43 includes a flange 110 having an outer edge 112 that defines a generally planar surface 114. Flange 110 supports a captive mounting fastener 117 that is configured to couple fitting 43 to a substrate, for example, rail 5. Captive mounting fastener 117 is shown in the form of a threaded fastener 120 having a knob 123. Knob 123 may be operated to rotate threaded fastener 120 into engagement with a threaded opening (not shown) provided on rail 5. Captive mounting fastener 117 is configured to be retained by flange 110 regardless of an external connection. In still further accordance with an exemplary embodiment, fitting 43 includes a key member 130. Key member 130 is configured to maintain fitting 43 in a desired orientation on, for example, rail 5. Key member 130 takes the form of an elongated tab 134 that extends into an opening (not shown) on rail 5.

As shown in FIG. 4, second end 63 of second conduit 52 is joined with barb fitting 91 and retained with a clamp 144. Similarly, first end 64 of third conduit 54 is coupled to barb fitting 90 and retained with a clamp 145. If not coupled to a conduit that leads cooling fluid directly toward a computer system, third connection member 85 may be provided with a sensor 150. Sensor 150 may take on a variety of forms such as a level sensor, a flow sensor, a temperature sensor and the like. Sensor 150 may be configured to measure one or more parameters of cooling fluid flowing through fitting 43.

At this point it should be understood that the exemplary embodiments provide a flexible or readily reconfigurable cooling fluid manifold system that not only delivers cooling fluid to a desired heat producing source, but also may readily accept a sensor for monitoring a parameter of the cooling fluid. Specifically, the particular fittings employed in connection with the cooling fluid manifold system allows for quick manifold changes without the need for brazing or other joining operations. In addition, the incorporation of the flange and captive mounting element enables the fitting to be readily mounted to a substrate without requiring additional fasteners, cable ties or the like. Also, the use of the key member facilitates orientation of the fitting while also preventing inadvertent rotation.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated While the preferred embodiments have been described, it will be understood that those skilled in the art, both now and in the future, may make various improvements and enhancements which fall within the scope of the claims which follow. These claims should be construed to maintain the proper protection for the invention first described.

What is claimed is:

1. A fitting comprising:
   a body;
   a first connection member provided on the body;
   a second connection member provided on the body opposite to the first connection member;
   a third connection member provided on the body generally perpendicular to the first and second connection members;
   a flange extending from the body substantially perpendicular to the first, second, and third connection members, the flange including a captive mounting fastener configured and disposed to secure the fitting to a substrate; and
   a key member extending from the body substantially opposite to the third connection member, the captive mounting fastener and the key member being configured to extend into respective openings of the substrate and disposed to establish a desired orientation of the fitting relative to the substrate.

2. The fitting according to claim 1, wherein the captive mounting fastener comprises a threaded fastener.

3. The fitting according to claim 1, wherein the key member comprises an elongated tab.

4. The fitting according to claim 1, wherein at least one of the first and second connection members comprises a barb fitting.

5. The fitting according to claim 1, wherein each of the first and second connection members comprises a barb fitting.

6. The fitting according to claim 1, wherein the third connection member comprises a quick connect fitting.

7. The fitting according to claim 1, wherein each of the first and second connection members comprises a barb fitting and the third connection member comprises a quick connect fitting.

8. A cooling fluid manifold system comprising:
   at least one fitting including a body,
   a first connection member provided on the body, a second connection member provided on the body opposite to the first connection member, a third connection member provided on the body generally perpendicular to the first and second connection members, a flange extending from the body substantially perpendicular to the first, second, and third connection members, the flange including a captive mounting fastener configured and disposed to secure the fitting to a substrate, and a key member extending from the body substantially opposite to the third connection member, the captive mounting fastener and the key member being configured to extend into respective openings of the substrate and disposed to establish a desired orientation of the fitting relative to the substrate;
   a first conduit operatively connected to the first connection member; and
   a second conduit operatively connected to the second connection member.

9. The cooling fluid manifold system according to claim 8, further comprising: a fluid sensor operatively connected to the third connection member.

10. The cooling fluid manifold system according to claim 9, wherein the fluid sensor comprises one of a level sensor, a flow sensor, and a temperature sensor.

11. The cooling fluid manifold system according to claim 8, wherein the first conduit comprises flexible tubing and the second conduit comprises rigid tubing.

12. The cooling fluid manifold system according to claim 8, wherein each of the first and second conduits comprises flexible tubing.

13. A computer rack system comprising:
a plurality of rail members supporting at least one tier;
at least one computer system supported by the at least one tier; and
a cooling fluid manifold system coupled to one of the plurality of rails, the cooling fluid manifold system comprising:
at least one fitting including a body, a first connection member provided on the body, a second connection member provided on the body opposite to the first connection member, a third connection member provided on the body generally perpendicular to the first and second connection members, a flange extending from the body substantially perpendicular to the first, second, and third connection members, the flange including a captive mounting fastener operatively connected to the one of the plurality of rails, and a key member extending from the body substantially opposite to the third connection member, the captive mounting fastener and the key member being configured to extend into respective openings of the one of the plurality of rails establishing a desired orientation of the fitting relative to the one of the plurality of rails;
a first conduit operatively connected to the first connection member; and
a second conduit operatively connected to the second connection member.

14. The computer rack system according to claim 13, wherein the cooling fluid manifold system further comprises: a fluid sensor operatively connected to the third connection member.

15. The computer rack system according to claim 14, wherein the fluid sensor comprises one of a level sensor, a flow sensor, and a temperature sensor.

16. The computer rack system according to claim 13, wherein the first conduit comprises flexible tubing and the second conduit comprises rigid tubing.

* * * * *